United States Patent
Arisoy et al.

(10) Patent No.: US 10,216,172 B2
(45) Date of Patent: Feb. 26, 2019

(54) FUNCTIONAL 3-D: OPTIMIZED LATTICE PARTITIONING OF SOLID 3-D MODELS TO CONTROL MECHANICAL PROPERTIES FOR ADDITIVE MANUFACTURING

(71) Applicant: Siemens Aktiengesellschaft, Munich (DE)

(72) Inventors: Erhan Arisoy, Princeton, NJ (US); Lucia Mirabella, Plainsboro, NJ (US); Suraj Ravi Musuvathy, Princeton, NJ (US); Ayse Parlak, Princeton, NJ (US)

(73) Assignee: SIEMENS AKTIENGESELLSCHAFT, München (DE)

( * ) Notice: Subject to any disclaimer, the term of this patent is extended or adjusted under 35 U.S.C. 154(b) by 249 days.

(21) Appl. No.: 15/269,634

(22) Filed: Sep. 19, 2016

(65) Prior Publication Data

US 2017/0083003 A1     Mar. 23, 2017

Related U.S. Application Data

(60) Provisional application No. 62/220,427, filed on Sep. 18, 2015.

(51) Int. Cl.
*G06F 17/50*     (2006.01)
*G05B 19/4099*   (2006.01)

(52) U.S. Cl.
CPC ......... *G05B 19/4099* (2013.01); *G06F 17/50* (2013.01); *G05B 2219/49023* (2013.01)

(58) Field of Classification Search
CPC .................................................. G05B 19/4099
USPC ....................................... 700/97–98, 112–121
See application file for complete search history.

(56) References Cited

U.S. PATENT DOCUMENTS

| | | | | |
|---|---|---|---|---|
| 4,272,890 A | * | 6/1981 | Davert | B64F 5/10 33/562 |
| 4,758,534 A | * | 7/1988 | Derkits, Jr. | H01L 21/28 117/108 |
| 2005/0219245 A1 | * | 10/2005 | Tao | G06T 17/20 345/424 |

(Continued)

OTHER PUBLICATIONS

Rosen, David W. "Design for additive manufacturing: a method to explore unexplored regions of the design space." Eighteenth Annual Solid Freeform Fabrication Symposium. Austin, TX: University of Texas at Austin (freeform), 2007.pp. 402-415 (Year: 2007).*

(Continued)

*Primary Examiner* — Satish Rampuria

(57) ABSTRACT

A computer-implemented method of optimized lattice partitioning of solid 3-D models for additive manufacturing includes a computer receiving a 3-D model of an object to be printed and functional specifications indicating desired mechanical properties for portions of the object. The computer generates a plurality of lattice template structures based on the 3-D model and a uniform grid structure of an internal surface of the object. The computer determines material behaviors for each of the plurality of lattice template structures using the functional specifications and assigns the lattice template structures to locations in the uniform grid structure based on the material behaviors of the lattice template structures, thereby yielding a printable lattice.

20 Claims, 6 Drawing Sheets

(56) References Cited

U.S. PATENT DOCUMENTS

2014/0324204 A1* 10/2014 Vidimce ............. B29C 67/0088
                        700/98
2015/0193559 A1* 7/2015 Musuvathy .......... B29O 64/386
                        703/1

OTHER PUBLICATIONS

Kim, Duck Bong, et al. "Streamlining the additive manufacturing digital spectrum: A systems approach." Additive manufacturing 5 (2015): pp. 20-30. (Year: 2015).*

Li, Dawei, et al. "Interior structural optimization based on the density-variable shape modeling of 3D printed objects." The International Journal of Advanced Manufacturing Technology 83.9-12 (2016): pp. 1627-1635. (Year: 2016).*

* cited by examiner

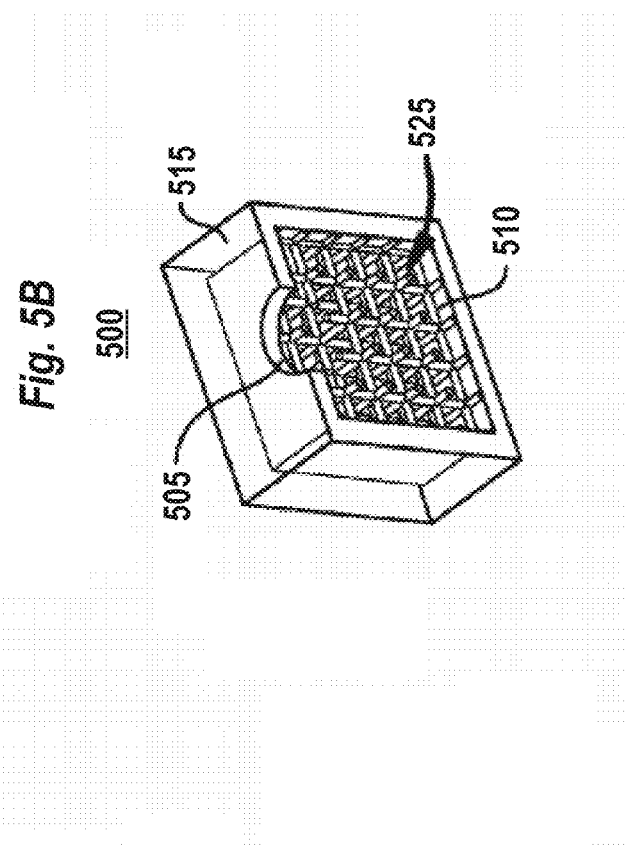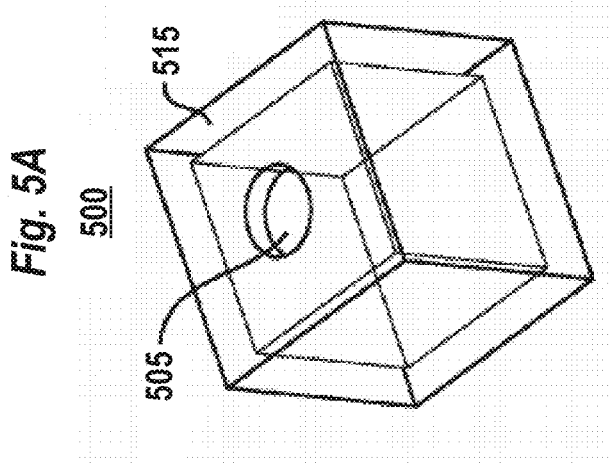

FUNCTIONAL 3-D: OPTIMIZED LATTICE PARTITIONING OF SOLID 3-D MODELS TO CONTROL MECHANICAL PROPERTIES FOR ADDITIVE MANUFACTURING

CROSS-REFERENCE TO RELATED APPLICATIONS

This application claims the benefit of U.S. Provisional Application Ser. No. 62/220,427 filed Sep. 18, 2015, which is incorporated herein by reference in its entirety.

TECHNICAL FIELD

The present disclosure relates to the optimized lattice partitioning of solid 3-D models for additive manufacturing to control mechanical properties. The technology described herein is particularly well-suited for, but not limited to, additive manufacturing based on computer aided designed-based models.

BACKGROUND

Recent advances and price drops in additive manufacturing technology have made three-dimensional (3-D) printers more affordable than ever before. Although their wide-scale adoption of such printers is expanding day by day, a key challenge in 3-D printing technology is using a single fabrication material with prefixed material properties which limits the applicability of additive manufacturing to a small set of commercial products. There is a need and desire to perform 3-D printing with a mix of materials such that different portions of the object being printed may have different functional properties. However, conventional techniques are generally limited in how materials can be mixed during additive manufacturing. Moreover, even where mixing is permitted, it is generally done in a very rough manner that does not result in smooth transitions between the different types of materials being used for printing.

SUMMARY

Embodiments of the present invention address and overcome one or more of the above shortcomings and drawbacks, by providing methods, systems, and apparatuses related to the optimized lattice partitioning of solid 3-D models for additive manufacturing to control mechanical properties. More specifically, the techniques described herein address the challenge of fabricating 3-D printed objects with desired functional properties such as thermal and structural properties. Instead of focusing on a single material property, a pipeline is utilized that can be useful for a wide variety of functional properties. The disclosed techniques use a data-driven approach and capability of integrating multi-physics functionalities while preserving a smooth functional transition.

A computer-implemented method of optimized lattice partitioning of solid 3-D models for additive manufacturing includes a computer receiving a 3-D model of an object to be printed (e.g., a computer-aided design (CAD) model) and functional specifications indicating desired mechanical properties for portions of the object. The computer generates a plurality of lattice template structures based on the 3-D model and a uniform grid structure of an internal surface of the object. The computer determines material behaviors for each of the lattice template structures using the functional specifications. The material behaviors for each of the plurality of lattice template structures may be determined, for example, by simulating the material behaviors of each lattice template structure at object scale with periodic boundary conditions. Then, the computer assigns the lattice template structures to locations in the uniform grid structure based on the material behaviors of the lattice template structures, thereby yielding a printable lattice. In some embodiments, the lattice template structures are assigned to location in the uniform grid structure according to an optimization problem. This optimization problem may be solved, for example, using a graph and tree search technique such as branch and bound.

Various techniques may be used for generating the lattice template structures used in the aforementioned method. In some embodiments, the lattice template structures are generated using implicit volumetric representations of the object such as, for example, voxel occupancy grids or level-sets of 3D scalar fields.

According to another aspect of the present invention, an article of manufacture for optimized lattice partitioning of solid 3-D models for additive manufacturing comprises a non-transitory, tangible computer-readable medium. This medium holds computer-executable instructions for performing a method comprising generating a plurality of lattice template structures based on a user-specified 3-D model of an object to be printed and generating a uniform grid structure of an internal surface of the object. The performed method may further include determining material behaviors for each of the plurality of lattice template structures using user-specified functional specifications indicating desired mechanical properties for portions of the object and assigning the plurality of lattice template structures to locations in the uniform grid structure based on the material behaviors of the lattice template structures, thereby yielding a printable lattice.

According to other embodiments, a system partitioning a model to facilitate printing of the model on a three-dimensional printer comprises one or more 3-D printers, one or more processors, and a non-transitory, computer-readable storage medium in operable communication with the processors. The computer-readable storage medium comprises one or more programming instructions that, when executed, cause the processors to generate a plurality of lattice template structures based on a user-specified 3-D model of an object, determine material behaviors for each of the lattice template structures using user-specified functional specifications, and generate a printable lattice by assigning the lattice template structures to locations in a uniform grid structure based on material behaviors of the lattice template structures. The 3-D printers are configured to print representations of the object based on the printable lattice. In some embodiments, the aforementioned system further comprises a parallel processing platform comprising the one or more processors and configured to determine the material behaviors for two or more of the lattice template structures in parallel.

Additional features and advantages of the invention will be made apparent from the following detailed description of illustrative embodiments that proceeds with reference to the accompanying drawings.

BRIEF DESCRIPTION OF THE DRAWINGS

The foregoing and other aspects of the present invention are best understood from the following detailed description when read in connection with the accompanying drawings. For the purpose of illustrating the invention, there are shown in the drawings embodiments that are presently preferred, it being understood, however, that the invention is not limited to the specific instrumentalities disclosed. Included in the drawings are the following Figures:

FIG. 5A illustrates a cube shaped shell with an opening region cutting the top region of the shell in accordance with disclosed embodiments;

FIG. 5B illustrates a sectioned view of the cube shaped shell with the opening region including a lattice structure created within the void region in accordance with disclosed embodiments.

DETAILED DESCRIPTION

Systems, methods, and apparatuses are described herein which relate generally to optimized lattice partitioning of solid 3-D models to control mechanical properties for additive manufacturing. The techniques described herein enable the design, assembly and fabrication of small microscale lattice structures with varying topological configurations to mimic different material behaviors at the object scale. A smooth functional property map is used to prevent generation of two neighboring lattice templates with abrupt changes in material properties. For example, if the designer would like to have a beam model that is softer on one edge and stiffer on the other edge, there can be a smooth transition between different lattice templates. Without such a transition, lattices would structurally fail because of stress concentration between two lattices that differ abruptly in terms of elasticity.

Figure 1:
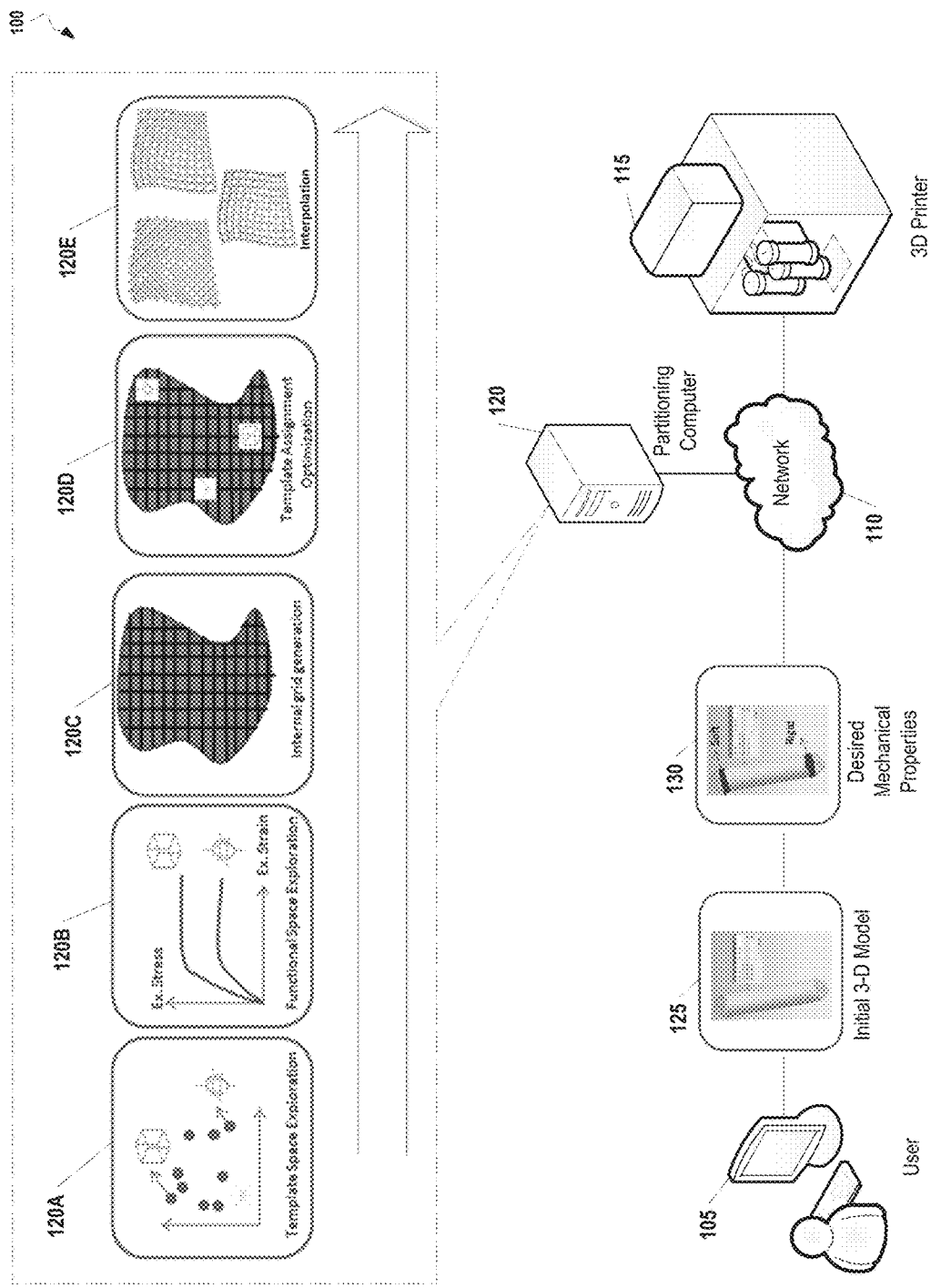
FIG. 1 illustrates a system for partitioning 3-D models to support additive manufacturing applications, according to some embodiments of the present invention

FIG. 1 illustrates a system 100 for partitioning 3-D models to support additive manufacturing applications, according to some embodiments of the present invention. A User Computer 105 is used to generate an Initial 3-D model 125 of the object of interest. Any technique known in the art may be used for generating the 3-D model. For example, in some embodiments, computer-aided design (CAD) software is used to directly create the 3-D models at the User Computer 105 in a graphical user interface (GUI). These models may include, for example, a 3-D solid CAD part. In other embodiments, the 3-D model may be based on one or more previously acquired images. For example, in medical printing applications, 3-D data may be acquired using an imaging device such as, without limitation, a Magnetic Resonance Imaging (MRI) scanner, a Computed Tomography (CT) scanner, a Positron Emission Tomography (PET) scanner, or an ultrasound device. The acquired data may then be processed at the imaging device or the User Computer 105 to produce a 3-D model of the anatomy of interest. Additionally, in some embodiments, imaging data may be acquired using multiple techniques and aggregated to provide a combined view of the object of interest.

Aside from the Initial 3-D Model 125, Desired Mechanical Properties 130 are specified. These Desired Mechanical Properties 130 may be specified by the user or derived based on product requirements. Various levels of detail may be used in specifying the Desired Mechanical Properties 130. For example, as shown in FIG. 1, the Desired Mechanical Properties 130 may be expressed in broad terms such as indicating which portions of the object should be "soft" and which should be "rigid." Alternatively, specific tolerances or other values may be specified as the Desired Mechanical Properties 130.

Continuing with the example of FIG. 1, a Partitioning Computer 120 receives the Initial 3-D Model 125 and the Desired Mechanical Properties 130 from the User Computer 105 via a computer network 110. In some embodiments, the Partitioning Computer 120 operates as part of a product lifecycle management (PLM) or product data management (PDM) system. In other embodiments, the Partitioning Computer 120 may be tightly coupled to the 3-D Printer 115. For example, although the Partitioning Computer 120 is shown as physically separate from the 3-D Printer 115 in the example of FIG. 1, in other embodiments, the functionality of the Partitioning Computer 120 may be included inside the printer itself.

This computer network 110 may be configured using a variety of hardware platforms. For example, the computer network 110 may be implemented using the IEEE 802.3 (Ethernet) or IEEE 802.11 (wireless) networking technologies, either separately or in combination. In addition, the computer network 110 may be implemented with a variety of communication tools including, for example, TCP/IP suite of protocols. In some embodiments, the computer network 110 is the Internet. A virtual private network (VPN) may be used to extend a private network across the computer network 110.

The Partitioning Computer 120 employs a data-driven approach to control functional properties (e.g., thermal, structural, weight distribution) of 3-D printed objects by utilizing and optimizing different families of lattice template structures. Boxes 120A-120D describe the workflow from processing the Initial 3-D Model 125 and the Desired Mechanical Properties 130. Starting at stage 120A, a plurality of template lattice structures are derived based on the Initial 3-D Model 125. With the template space defined, the functional aspects of the design are explored by using the Desired Mechanical Properties 130 to derive functional properties for each template lattice structure. As described in further detail below with respect to FIG. 2, these functional properties are derived by applying one or more models of functional characteristic to each template lattice structure. Thus, following stage 120B, each template lattice structure has different functional characteristic such as varying stiffness or thermal conductivity defined at the microscale level. At stage 120C, an internal grid structure is defined. Then, at stage 120D the template lattice structures are assigned to grid based on their derived functional characteristics such that the Desired Mechanical Properties 130 are achieved at object scale while satisfying different constraints between neighboring lattice cells (e.g., connectivity). It may not be possible to 3-D print the cell template assignments made by the optimization due to differences in geometry between varying cell templates. To alleviate this challenge, an interpolation stage 120E is employed that interpolates cell template geometry within entire part file.

Once the lattice is generated by the Partitioning Computer 120, it may then be printed via 3-D Printer 115. This 3-D Printer may generally be any three-dimensional printer generally known in the art. Additionally, in some embodiments, hybrid devices such as the big area additive manufacturing machines (BAMM) may be used which combine 3-D printing with computer numerical control (CNC) routing. Moreover, the general techniques presented in FIG. 1 may be extended to specialized printers. For example, in some embodiments, the object of interest is a replacement organ and the 3-D Printer 115 is a bio-printer. As is understood in the art, a bio-printer uses additive manufacturing techniques to deposit living cell material in layers whose thickness depends on the tissue being printed. Once the 3-D Printer 115 has completed printing the organ, the tissues are stored in an incubator referred to as a "bio-reactor." While in the bio-reactor, the tissues mature in preparation of use in the patient's body. It should be noted that, in some embodiments, a specialized bio-printer may be used to print directly in the patient's body. In this case, the printed tissue can mature directly in the patient's body and incubation in the bio-reactor can be omitted.

Figure 2:
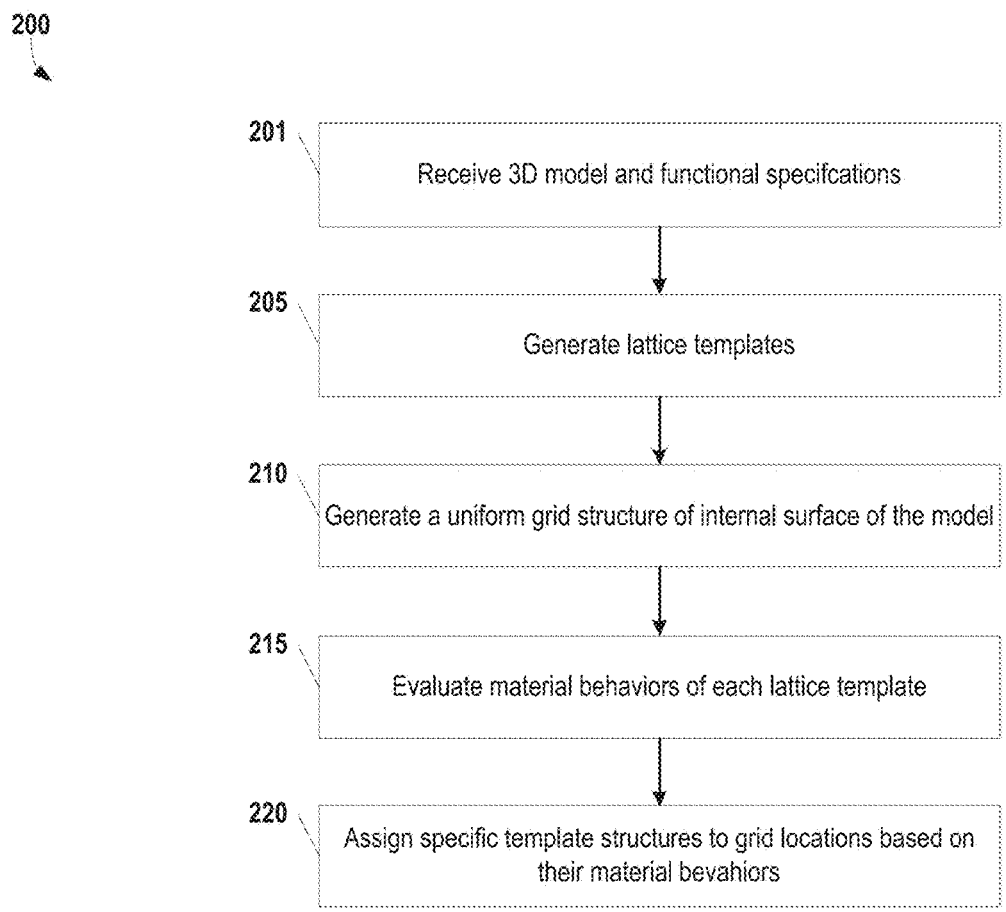
FIG. 2 illustrates an example process for performing optimized lattice partitioning of solid 3-D models, according to some embodiments.

FIG. 2 illustrates an example method 200 for performing optimized lattice partitioning of solid 3-D models, according to some embodiments. Starting at step 201, a 3-D model and one or more functional specifications are received, as described above with reference to FIG. 1. Next, at step 205, a plurality of lattice templates are generated using implicit volumetric representations of the object of interest. The utilization of implicit representations allows different Boolean operations to be performed efficiently and easily when merging two subsequent lattice cells.

Figure 3:
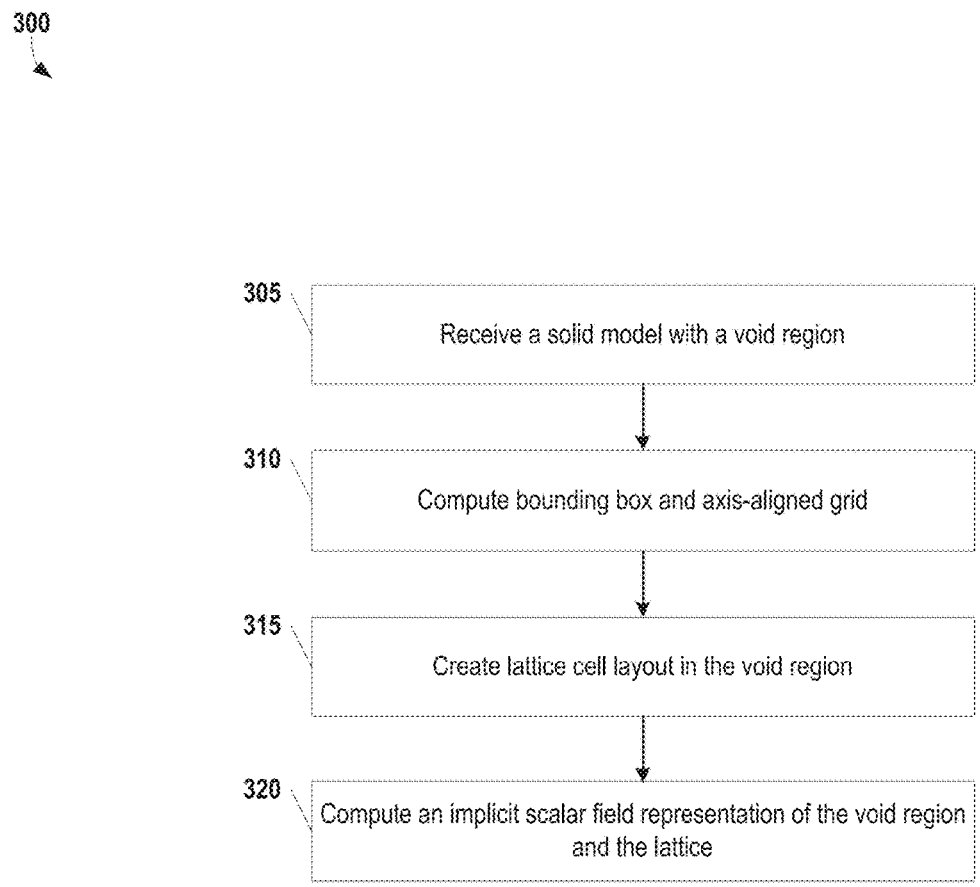
FIG. 3 provides a method for computing implicit scalar field representations of a void region of a model, according to some embodiments.
Figure 4A:
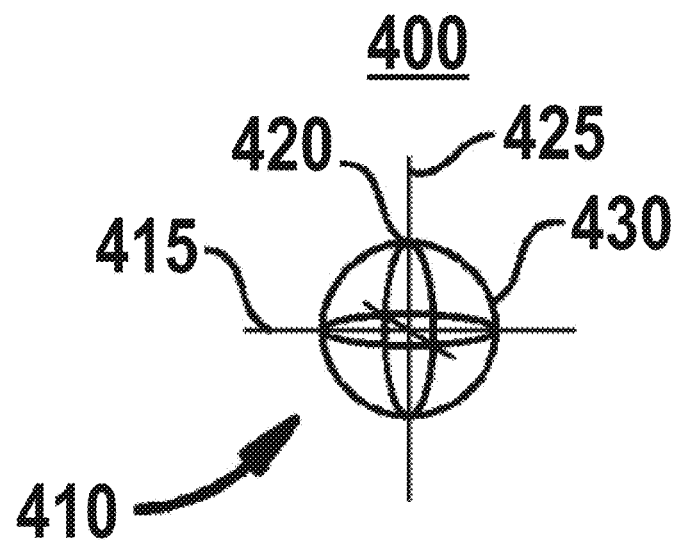
FIG. 4A illustrates an example of a lattice template in accordance with disclosed embodiments.
Figure 4B:
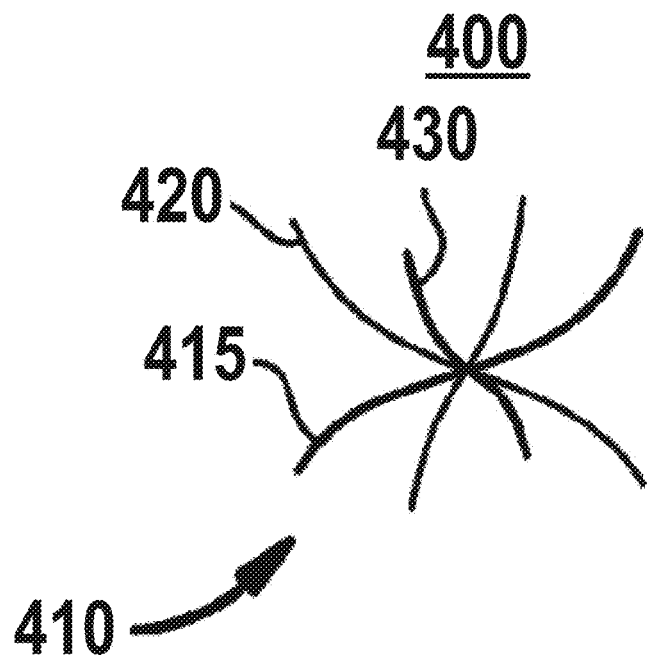
FIG. 4B illustrates a second example of a lattice template in accordance with disclosed embodiments.

In general, any implicit volumetric representation known in the art may be used as input to template generation including, without limitation, voxel occupancy grids and level-sets of 3D scalar fields. FIG. 3 describes an example method for generating the plurality of lattice templates, according to some embodiments. FIGS. 4A and 4B illustrate examples of lattice templates in accordance with disclosed embodiments. The lattice templates 400 are lattice skeletons created for maximizing the properties of the object. Each lattice template 400 is created within a unit cube 410, including edges 415 and vertexes 420. The lattice template 400 can be defined by line 425 and curve 430 segments. This enables 1D element CAE analysis, as in the case of rod lattices. The lattice template 400 can also be defined with any of the available modeling tools in a CAD system, creating flexibility in the creation of lattice templates 400.

Returning to FIG. 2, at step 210 the input solid 3-D model is analyzed to hollow it and generate a corresponding uniform grid structure internally. As described below, each of the grid cells will be filled with a lattice template that is identified by an optimization scheme to satisfy user-defined functional characteristic. Techniques for generating a grid structure on an internal surface are generally known in the art and, in general any such technique may be used at step 210.

At step 215, each template identified in step 205 is analyzed and simulated with periodic boundary conditions to evaluate their material behaviors at an object scale. In other words, a material property space is populated where every template provides a unique mechanical behavior. For example, if the desired functional property is a specific strain characteristic distribution on the input model, each template has a unique strain behavior.

Various material behavior models may be employed at step 215, depending on the functional specification provided by the user at step 201. To continue with the example of strain, a physics-based strain model may be employed to determine the strain of each lattice template structure based on its individual characteristics. In some instances, combined models may be used with output multiple functional characteristics for a particular lattice template structure. It should be noted that, for this portion of the method 200, each lattice templates structure is independent. Thus, in some embodiments, multiple structures may be analyzed simultaneously using a parallel computing platform such as NVIDIA CUDA™.

Step 220 is an optimization and analysis stage where an optimization algorithm assigns a specific template structure to every grid cell created in step 210 based on the material behaviors of each structure as determined at step 215. The objective of the optimization problem is minimizing the difference between the desired mechanical properties (supplied by the user) and current mechanical properties at object scale. In some embodiments, a graph and tree search technique such as branch and bound is used to solve this discrete optimization problem because of its combinatorial nature where variables are specific template assignments to each grid cell. In other embodiments, other combinatorial optimization techniques may be used in assigning the template structures to the grid.

FIG. 3 provides a method 300 for computing implicit scalar field representations of a void region of a model, according to some embodiments. These implicit scalar field representations may be used as the template structures described above with reference to FIG. 2. Starting step 305, the system receives a solid model containing a plurality of boundary surfaces for a void region $R_v$. The void region can be specified as either a volume to be hollowed from the solid model, with a constant or varying surface thickness, or as an empty region of the solid model, in which case, the hollowing operation can be skipped. The method 300 is applicable to any geometric representation for a set of boundary surfaces, S, of the void region for which point-to-surface distances can be computed and inside-outside queries can be determined. One or more opening bodies can be specified when the region to be lattified is not fully enclosed. For example, FIG. 5A illustrates a cube shaped shell 500 with an opening region 505 cutting the top region 515 of the shell 500 in accordance with disclosed embodiments. FIG. 5B illustrates a sectioned view of the cube shaped shell 500 with the opening region 505 including a lattice structure 510 created within the void region 525 that the shell 500 partly encloses in accordance with disclosed embodiments.

At step 310, the system computes a bounding box and a plurality of grid points on an axis-aligned grid within a bounding box. Let $V=v_i \in R^3$, $i=0 \ldots m$ be a collection of grid points lying on an axis-aligned grid that is a discrete representation of the volume within the bounding box of S. Equations 1-3 below define an implicit surface, $\varphi$, by a set of coefficients defined at each grid point $v_i$.

$$(\phi(x)<0 => x \text{ inside} \tag{1}$$

$$(\phi(x)=0 => x \text{ on the boundary} \tag{2}$$

$$(\phi(x)>0 => x \text{ is outside} \tag{3}$$

At any point in space within the bounding box, $x \in R^3$, $(\varphi(x)$ can be computed by interpolating the coefficients of the neighboring grid points. The point x can then be classified to be lying inside (Equation 1), on the surface (Equation 2), or outside (Equation 3) of the region $R_v$.

At step 315, the system creates a lattice cell layout for a lattice structure within the void region. A lattice cell layout, $-1_j$, $j=0 \ldots n$, covering the void region to be lattified is created. For the rod or beam type lattice, the lattice cell layout can be any type of element, for instance tetrahedra, hexahedra, etc. For the template type lattice, each lattice cell is a hexahedron that is homeomorphic to the lattice cell. Any volumetric mesh generation process can be used for grid creation, the simplest being an axis-aligned grid creation. The final object will contain the lattice trimmed away by the boundary surfaces of the void region.

At step 320, the system computes an implicit model representation of the solid model defined by a scalar value for each of the grid points on the axis-aligned grid. The discrete implicit representation spans the bounding box of the void region. If opening bodies are present, the opening regions are also converted to discrete implicit representations. Distance fields are used as implicit surface representations, i.e., the coefficients are signed distances to S or surface distances. The distance field is a calculation for model values of the minimum distance from each grid point to one of the boundary surfaces.

Equation 4 defines the iso-surface $\theta_{O(L)}(v_i)=0$ of the boundary surfaces. While the grid point is part of the void region, the sign is negative as in Equation 5. While the grid point is not part of the void region, the sign is positive as in Equation 6. As discussed above with equation 2, a negative sign corresponds to grid points that are external to the lattice structure and a positive sign corresponds to grid points that are internal to the lattice structure.

$$\theta_S(v_i)=\text{sign}*\text{argmin}_S\|v_i-S\| \quad (4)$$

$$v_i \cap R_v=\phi => \text{sign}=1 \quad (5)$$

$$v_i \cap R_v=v_i => \text{sign}=-1 \quad (6)$$

Equation 7 may be used if hollowing is required, and the surface thickness at the computed closest surface point is subtracted from the surface distance value to calculate the hollowed surface. Let $s \in S$ be the closest surface point to the grid point and let $t_s$ be the surface thickness specified at the closest surface point, s. The iso-surface $\theta_{O(S)}=0$ gives the variable thickness offset to the boundary surfaces as specified by the thickness field. Non-uniform hollowing can be performed using scaled distance fields defined over a volumetric mesh.

$$\theta_{O(S)}(v_i)=\theta_S(v_i)-t_s. \quad (7)$$

In some embodiments, a cell template can also be specified to be applied within the lattice. The template shape is defined within a lattice cell. An associated thickness defines the surface of a lattice shape within a cell as an offset of the skeleton. The lattice template is applied at each lattice cell after suitable transformation (including perhaps morphing) from the definition within a lattice cell.

In Equation 8, at each grid point, $v_i$, of the volume, the lattice distance to the closest lattice cell shape is also computed. X represents the transformed representation of the lattice cell template into the closest lattice cell $l_j$. For a rod/beam type lattice, the lattice grid edges are themselves used as the cell template and the lattice distances are computed from them. The closest lattice cell, $l_j$, to the grid point is first identified. In the instance the grid point lies on an edge or vertex of the closest lattice cell, the neighboring lattice cells of the closest lattice cell are also considered. The lattice template is appropriately transformed into the shape of the closest lattice cell and the lattice distance to the transformed representation of the template skeleton is then computed. Cell templates can be extended to evaluate analytic functions. Instead of computing distance fields to cell templates, the analytic functions may be evaluated at corresponding grid points $v_i$ within closest lattice cells $l_j$.

$$\theta_L(v_i)=\text{argmin}_X\|v_i-X\| \quad (8)$$

In Equation 9, the thickness value representing the lattice thickness, $t_L$, is subtracted from the lattice distance. The thickness value can also be scaled according to the size of the closest lattice cell $l_j$ relative to a model lattice cell. The iso-surface $\theta_{O(L)}(v_i)=0$ gives the lattice surface.

$$\theta_{O(L)}(v_i)=\theta_L(v_i)-t_L \quad (9)$$

In equation 10, a Boolean combination of the surface distance, $\theta_{O(S)}(v_i)$, and the lattice distance, $\theta_{O(L)}(v_i)$, is then set as the scalar value at each corresponding grid point. The iso-surface $\theta_F=0$ gives the lattice surfaces bounded by the surfaces S or the internal surfaces generated by the variable thickness offset to S. If opening bodies are present, the distance fields are also combined to create the appropriately oriented lattice surface.

$$\theta_F=\min(\theta_{O(S)}, \theta_{O(L)}) \quad (10)$$

Figure 6:
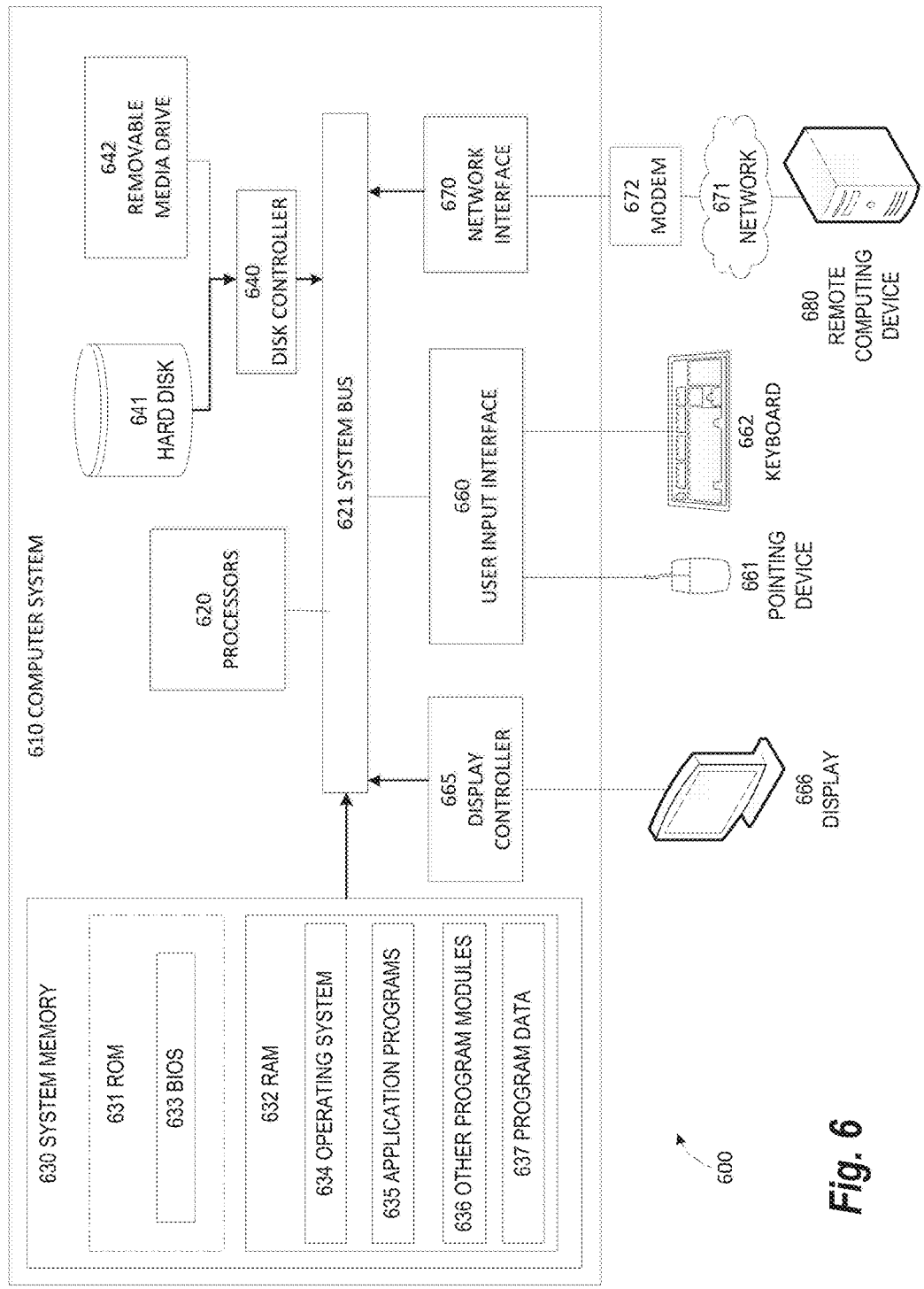
FIG. 6 illustrates an exemplary computing environment within which embodiments of the invention may be implemented.

FIG. 6 illustrates an exemplary computing environment 600 within which embodiments of the invention may be implemented. In some embodiments, the computing environment 600 may be used to implement one or more of the components illustrated in the system 100 of FIG. 1. For example, this computing environment 600 may be configured to execute the methods 200, 300 described above with respect to FIGS. 2 and 3, respectively. Computers and computing environments, such as computer system 610 and computing environment 600, are known to those of skill in the art and thus are described briefly here.

As shown in FIG. 6, the computer system 610 may include a communication mechanism such as a bus 621 or other communication mechanism for communicating information within the computer system 610. The computer system 610 further includes one or more processors 620 coupled with the bus 621 for processing the information. The processors 620 may include one or more central processing units (CPUs), graphical processing units (GPUs), or any other processor known in the art.

The computer system 610 also includes a system memory 630 coupled to the bus 621 for storing information and instructions to be executed by processors 620. The system memory 630 may include computer readable storage media in the form of volatile and/or nonvolatile memory, such as read only memory (ROM) 631 and/or random access memory (RAM) 632. The system memory RAM 632 may include other dynamic storage device(s) (e.g., dynamic RAM, static RAM, and synchronous DRAM). The system memory ROM 631 may include other static storage device(s) (e.g., programmable ROM, erasable PROM, and electrically erasable PROM). In addition, the system memory 630 may be used for storing temporary variables or other intermediate information during the execution of instructions by the processors 620. A basic input/output system (BIOS) 633 containing the basic routines that help to transfer information between elements within computer system 610, such as during start-up, may be stored in ROM 631. RAM 632 may contain data and/or program modules that are immediately accessible to and/or presently being operated on by the processors 620. System memory 630 may additionally include, for example, operating system 634, application programs 635, other program modules 636 and program data 637.

The computer system 610 also includes a disk controller 640 coupled to the bus 621 to control one or more storage devices for storing information and instructions, such as a hard disk 641 and a removable media drive 642 (e.g., floppy disk drive, compact disc drive, tape drive, and/or solid state drive). The storage devices may be added to the computer system 610 using an appropriate device interface (e.g., a small computer system interface (SCSI), integrated device electronics (IDE), Universal Serial Bus (USB), or FireWire).

The computer system 610 may also include a display controller 665 coupled to the bus 621 to control a display 666, such as a cathode ray tube (CRT) or liquid crystal display (LCD), for displaying information to a computer user. The computer system includes an input interface 660 and one or more input devices, such as a keyboard 662 and a pointing device 661, for interacting with a computer user and providing information to the processor 620. The pointing device 661, for example, may be a mouse, a trackball, or a pointing stick for communicating direction information and command selections to the processor 620 and for controlling cursor movement on the display 666. The display 666 may provide a touch screen interface which allows input to supplement or replace the communication of direction information and command selections by the pointing device 661.

The computer system 610 may perform a portion or all of the processing steps of embodiments of the invention in response to the processors 620 executing one or more sequences of one or more instructions contained in a memory, such as the system memory 630. Such instructions may be read into the system memory 630 from another computer readable medium, such as a hard disk 641 or a removable media drive 642. The hard disk 641 may contain one or more datastores and data files used by embodiments of the present invention. Datastore contents and data files may be encrypted to improve security. The processors 620 may also be employed in a multi-processing arrangement to execute the one or more sequences of instructions contained in system memory 630. In alternative embodiments, hard-wired circuitry may be used in place of or in combination with software instructions. Thus, embodiments are not limited to any specific combination of hardware circuitry and software.

As stated above, the computer system 610 may include at least one computer readable medium or memory for holding instructions programmed according to embodiments of the invention and for containing data structures, tables, records, or other data described herein. The term "computer readable medium" as used herein refers to any medium that participates in providing instructions to the processor 620 for execution. A computer readable medium may take many forms including, but not limited to, non-volatile media, volatile media, and transmission media. Non-limiting examples of non-volatile media include optical disks, solid state drives, magnetic disks, and magneto-optical disks, such as hard disk 641 or removable media drive 642. Non-limiting examples of volatile media include dynamic memory, such as system memory 630. Non-limiting examples of transmission media include coaxial cables, copper wire, and fiber optics, including the wires that make up the bus 621. Transmission media may also take the form of acoustic or light waves, such as those generated during radio wave and infrared data communications.

The computing environment 600 may further include the computer system 610 operating in a networked environment using logical connections to one or more remote computers, such as remote computer 680. Remote computer 680 may be a personal computer (laptop or desktop), a mobile device, a server, a router, a network PC, a peer device or other common network node, and typically includes many or all of the elements described above relative to computer system 610. When used in a networking environment, computer system 610 may include modem 672 for establishing communications over a network 671, such as the Internet. Modem 672 may be connected to bus 621 via user network interface 670, or via another appropriate mechanism.

Network 671 may be any network or system generally known in the art, including the Internet, an intranet, a local area network (LAN), a wide area network (WAN), a metropolitan area network (MAN), a direct connection or series of connections, a cellular telephone network, or any other network or medium capable of facilitating communication between computer system 610 and other computers (e.g., remote computer 680). The network 671 may be wired, wireless or a combination thereof. Wired connections may be implemented using Ethernet, Universal Serial Bus (USB), RJ-11 or any other wired connection generally known in the art. Wireless connections may be implemented using Wi-Fi, WiMAX, Bluetooth, infrared, cellular networks, satellite or any other wireless connection methodology generally known in the art. Additionally, several networks may work alone or in communication with each other to facilitate communication in the network 671.

The embodiments of the present disclosure may be implemented with any combination of hardware and software. In addition, the embodiments of the present disclosure may be included in an article of manufacture (e.g., one or more computer program products) having, for example, computer-readable, non-transitory media. The media has embodied therein, for instance, computer readable program code for providing and facilitating the mechanisms of the embodiments of the present disclosure. The article of manufacture can be included as part of a computer system or sold separately.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters.

A graphical user interface (GUI), as used herein, comprises one or more display images, generated by a display processor and enabling user interaction with a processor or other device and associated data acquisition and processing functions. The GUI also includes an executable procedure or executable application. The executable procedure or executable application conditions the display processor to generate signals representing the GUI display images. These signals are supplied to a display device which displays the image for viewing by the user. The processor, under control of an executable procedure or executable application, manipulates the GUI display images in response to signals received from the input devices. In this way, the user may interact with the display image using the input devices, enabling user interaction with the processor or other device.

The functions and process steps herein may be performed automatically or wholly or partially in response to user command. An activity (including a step) performed automatically is performed in response to one or more executable instructions or device operation without user direct initiation of the activity.

The system and processes of the figures are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. As described herein, the various systems, subsystems, agents, managers and processes can be implemented using hardware components, software components, and/or combinations thereof. No claim element herein is to be construed under the provisions of 35 U.S.C. 112, sixth paragraph, unless the element is expressly recited using the phrase "means for."

The invention claimed is:

1. A computer-implemented method of optimized lattice partitioning of solid 3-dimensional models for additive manufacturing, the method comprising:
   receiving, by a computer, a 3-dimensional model of an object to be printed;
   receiving, by the computer, functional specifications indicating desired stiffness properties for portions of the object;
   generating, by the computer, a plurality of lattice template structures based on the 3-dimensional model;
   generating, by the computer, a uniform grid structure of an internal surface of the object;
   determining, by the computer, stiffness behaviors for each of the plurality of lattice template structures using the functional specifications; and
   assigning, by the computer, the plurality of lattice template structures to locations in the uniform grid structure based on the stiffness behaviors of the lattice template structures, thereby yielding a printable lattice.

2. The method of claim 1, wherein the 3-dimensional model comprises a computer-aided design (CAD) model of the object.

3. The method of claim 1, wherein the stiffness behaviors for each of the plurality of lattice template structures are determined by simulating the stiffness behaviors of each lattice template structure at object scale with periodic boundary conditions.

4. The method of claim 1, wherein the plurality of lattice template structures are generated using implicit volumetric representations of the object.

5. The method of claim 4, wherein the implicit volumetric representations of the object comprise voxel occupancy grids.

6. The method of claim 4, wherein the implicit volumetric representations of the object comprise level-sets of 3dimensional scalar fields.

7. The method of claim 1, wherein the plurality of lattice template structures are assigned to location in the uniform grid structure according to an optimization problem.

8. The method of claim 7, wherein the optimization problem is solved using a graph and tree search technique.

9. The method of claim 8, wherein the graph and tree search technique comprises a branch and bound technique.

10. An article of manufacture for optimized lattice partitioning of solid 3-dimensional models for additive manufacturing, the article of manufacture comprising a non-transitory, tangible computer-readable medium holding computer-executable instructions for performing a method comprising:
   generating a plurality of lattice template structures based on a user-specified 3-dimensional model of an object to be printed;
   generating a uniform grid structure of an internal surface of the object;
   determining stiffness behaviors for each of the plurality of lattice template structures using user-specified functional specifications indicating desired stiffness properties for portions of the object; and
   assigning the plurality of lattice template structures to locations in the uniform grid structure based on the stiffness behaviors of the lattice template structures, thereby yielding a printable lattice.

11. The article of manufacture of claim 10, wherein the user-specified 3-dimensional model comprises a computer-aided design (CAD) model of the object.

12. The article of manufacture of claim 10, wherein the stiffness behaviors for each of the plurality of lattice template structures are determined by simulating the stiffness behaviors of each lattice template structure at object scale with periodic boundary conditions.

13. The article of manufacture of claim 10, wherein the plurality of lattice template structures are generated using implicit volumetric representations of the object.

14. The article of manufacture of claim 13, wherein the implicit volumetric representations of the object comprise voxel occupancy grids.

15. The article of manufacture of claim 13, wherein the implicit volumetric representations of the object comprise level-sets of 3-dimensional scalar fields.

16. The article of manufacture of claim 10, wherein the plurality of lattice template structures are assigned to location in the uniform grid structure according to an optimization problem.

17. The article of manufacture of claim 16, wherein the optimization problem is solved using a graph and tree search technique.

18. The article of manufacture of claim 17, wherein the graph and tree search technique comprises a branch and bound technique.

19. A system partitioning a model to facilitate printing of the model on a three-dimensional printer, the system comprising:
   one or more processors;
   a non-transitory, computer-readable storage medium in operable communication with the processors, wherein the computer-readable storage medium comprises one or more programming instructions that, when executed, cause the processors to:
   generate a plurality of lattice template structures based on a user-specified 3-dimensional model of an object,
   determine stiffness behaviors for each of the plurality of lattice template structures using user-specified functional specifications, and
   generate a printable lattice by assigning the plurality of lattice template structures to locations in a uniform grid structure based on stiffness behaviors of the lattice template structures; and one or more 3-dimensional printers configured to print representations of the object based on the printable lattice.

20. The system of claim 19, further comprising:

a parallel processing platform comprising the one or more processors and configured to determine the stiffness behaviors for two or more of the lattice template structures in parallel.

* * * * *